US012683080B2

(12) United States Patent
Jun et al.

(10) Patent No.: US 12,683,080 B2
(45) Date of Patent: Jul. 14, 2026

(54) ELECTRONIC COMPONENT AND SUBSTRATE WITH ELECTRONIC COMPONENT EMBEDDED THEREIN

(71) Applicant: SAMSUNG ELECTRO-MECHANICS CO., LTD., Suwon-si (KR)

(72) Inventors: Ho In Jun, Suwon-si (KR); Eon Ju Noh, Suwon-si (KR); Myung Duk Seo, Suwon-si (KR); Kyeong Jun Kim, Suwon-si (KR); Kyo Sik Kim, Suwon-si (KR); Da Jeong Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 198 days.

(21) Appl. No.: 18/601,290

(22) Filed: Mar. 11, 2024

(65) Prior Publication Data

US 2024/0387110 A1     Nov. 21, 2024

(30) Foreign Application Priority Data

May 18, 2023    (KR) ........................ 10-2023-0064260

(51) Int. Cl.
| | |
|---|---|
| *H01G 4/00* | (2006.01) |
| *H01G 4/232* | (2006.01) |
| *H01G 4/30* | (2006.01) |
| *H05K 1/185* | (2026.01) |

(52) U.S. Cl.
CPC ............. *H01G 4/2325* (2013.01); *H01G 4/30* (2013.01); *H05K 1/185* (2013.01); *H05K 2201/10015* (2013.01)

(58) Field of Classification Search
CPC ........ H01G 4/2325; H01G 4/30; H05K 1/185; H05K 2201/10015
See application file for complete search history.

(56) References Cited

U.S. PATENT DOCUMENTS

| | | | |
|---|---|---|---|
| 2010/0101836 A1 | 4/2010 | Sekimoto | |
| 2013/0294006 A1* | 11/2013 | Kang ........................ | H01B 1/22 |
| | | | 977/734 |
| 2017/0345564 A1* | 11/2017 | Ryu ...................... | H01G 4/2325 |
| 2019/0148074 A1* | 5/2019 | Terashita ............... | H01G 4/232 |
| | | | 361/321.2 |

(Continued)

FOREIGN PATENT DOCUMENTS

| | | |
|---|---|---|
| EP | 3 196 904 A1 | 7/2017 |
| JP | 3-214715 A | 9/1991 |

(Continued)

OTHER PUBLICATIONS

European Search Report dated Feb. 11, 2025 issued in the corresponding European Patent Application No. 24165106.6.

*Primary Examiner* — Pete T Lee
(74) *Attorney, Agent, or Firm* — Morgan, Lewis & Bockius LLP

(57) ABSTRACT

An electronic component includes a body including a dielectric layer and an internal electrode, and an external electrode disposed on the body, connected to the internal electrode, and including a low-reflection layer. Brightness of a surface of the low-reflection layer is lower than brightness of a surface of the body.

52 Claims, 21 Drawing Sheets

(56)                    References Cited

U.S. PATENT DOCUMENTS

| 2019/0148075 | A1* | 5/2019 | Nakamura ........... | H01G 13/006 |
| | | | | 361/301.1 |
| 2019/0355520 | A1* | 11/2019 | Nakamura ............. | H01G 4/012 |
| 2021/0151252 | A1 | 5/2021 | Nakamura et al. | |
| 2022/0051852 | A1* | 2/2022 | Tanaka ................... | H05K 1/185 |

FOREIGN PATENT DOCUMENTS

| JP | 8-115848 | A | 5/1996 |
| JP | 2009-206433 | A | 9/2009 |
| JP | 4840508 | B2 | 12/2011 |
| JP | 2021-027195 | A | 2/2021 |
| KR | 10-2021-0060319 | A | 5/2021 |

* cited by examiner

—150

A

161

162

160

A

A

ELECTRONIC COMPONENT AND SUBSTRATE WITH ELECTRONIC COMPONENT EMBEDDED THEREIN

CROSS-REFERENCE TO RELATED APPLICATION(S)

This application claims benefit of priority to Korean Patent Application No. 10-2023-0064260 filed on May 18, 2023 in the Korean Intellectual Property Office, the disclosure of which is incorporated herein by reference in its entirety.

TECHNICAL FIELD

The present disclosure relates to an electronic component and a substrate with an electronic component embedded therein.

Capacitors are a type of passive electronic component and correspond to elements that may store electricity. In the case of a capacitor, basically, two electrodes are opposed to each other, and when a voltage is applied thereto, electricity may be accumulated in respective electrodes. When a direct current voltage is applied, electricity is stored and current flows inside the capacitor, but when the accumulation thereof is completed, the current stops flowing. Meanwhile, when an alternating voltage is applied, the polarity of the electrode changes and an alternating current flows.

Such capacitors may be divided into several types, such as an aluminum electrolytic capacitor including electrodes formed of aluminum and having a thin oxide film between the aluminum electrodes, a tantalum capacitor using tantalum as an electrode material, a ceramic capacitor using a high dielectric constant dielectric such as titanium barium between electrodes, a multilayer ceramic capacitor (MLCC) using high-k ceramics in a multilayer structure as a dielectric provided between electrodes, a film capacitor using a polystyrene film as a dielectric between electrodes, and the like, depending on the type of insulator provided between electrodes.

Meanwhile, when electronic components such as capacitors and the like are embedded in a circuit board, the electronic components and circuit patterns may be connected through conductive vias. When forming a via hole penetrating through an insulating layer of a circuit board to form a conductive via, if the via hole is not formed precisely, connectivity between the circuit pattern and the electronic component may deteriorate. For example, if the via hole is not formed according to the intended specifications, problems such as defective plating seam or defective plating dimple may occur, which may lead to a decrease in the performance of a board with an electronic component embedded therein.

SUMMARY

An aspect of the present disclosure is to implement an electronic component having improved connectivity with a circuit pattern when embedded in a circuit board.

An aspect of the present disclosure is to implement a substrate with an electronic component embedded therein, having improved reliability.

According to an aspect of the present disclosure, a novel structure of electronic components is provided through an example. An electronic component includes a body including a dielectric layer and an internal electrode, and an external electrode disposed on the body, connected to the internal electrode, and including a low-reflection layer. Brightness of a surface of the low-reflection layer is lower than brightness of a surface of the body.

A brightness value of Hue Saturation Value (HSV) measured in an image of the surface of the low-reflection layer may be 45% or less.

The brightness of the surface of the low-reflection layer and the brightness of the surface of the body may be obtained by measuring intensity of reflected light of white light emitted from the same light source.

The body may include a first surface and a second surface opposing each other in a first direction in which the dielectric layer and the internal electrode are stacked, and a portion of the external electrode may cover a portion of the first surface of the body.

The brightness of the surface of the body may be measured on another portion of the first surface of the body, and the brightness of the surface of the low-reflection layer may be measured on a surface of an area covering the portion of the first surface of the body.

A thickness of an area covering the portion of the first surface of the body in the low-reflection layer may be 5 μm or more.

The low-reflection layer may include a plating layer containing Ni.

The low-reflection layer may include a Ni—Zn-based material.

The Ni—Zn-based material may further include S.

The plating layer may contain needle-shaped particles.

The needle-shaped particles may contain at least one of Na and Cl.

The low-reflection layer may include metal particles and an oxide film disposed on surfaces of the metal particles.

The metal particles may contain Ni, and the oxide film may contain $Ni_2O_3$.

The low-reflection layer may further include an insulator in which the metal particles are dispersed.

The metal particles may include at least one particle being in contact with the insulator and the oxide film.

The low-reflection layer may include a Ni sputtering layer.

The low-reflection layer may include an Ni—Zn alloy.

The low-reflection layer may be disposed on an outermost side of the external electrode.

The low-reflection layer may be directly connected to the internal electrode.

The external electrode may further include a base layer disposed between the body and the low-reflection layer.

The base layer may include at least one of Pd and Cu.

The body may include a first surface and a second surface opposing each other in a first direction in which the dielectric layer and the internal electrode are stacked, a third surface and a fourth surface located between the first and second surfaces and opposing each other in a second direction, and a fifth surface and a sixth surface located between the first and second surfaces and opposing each other in a third direction. The internal electrode may include a first internal electrode and a second internal electrode disposed alternately with each other. The external electrode may include a first external electrode and a second external electrode connected to the first and second internal electrodes, respectively.

The first and second internal electrodes may extend to the third and fourth surfaces of the body, respectively, and the first and second external electrodes may cover the third and fourth surfaces of the body, respectively.

The first and second internal electrodes may extend to the fifth and sixth surfaces of the body, respectively, the first and second external electrodes may cover the fifth and sixth surfaces of the body, respectively, and a length of the body in the second direction may be greater than a length in the third direction.

The first internal electrode may extend to the third and fourth surfaces of the body, and the second internal electrode may extend to the third and fourth surfaces of the body. The first and second external electrodes may be alternately disposed in the third direction on the third and fourth surfaces of the body.

The first internal electrode may extend to the first surface of the body, and the second internal electrode may extend to the first surface of the body. The first and second external electrodes may cover the first surface of the body.

The first external electrode may be provided as a plurality of first external electrodes, and the second external electrode may be disposed between the plurality of first external electrodes based on the third direction.

The first and second external electrodes may not be provided on the second surface of the body.

The first and second external electrodes may not be provided on the fifth and sixth surfaces of the body.

The first internal electrode may extend to the fifth and sixth surfaces of the body, and the second internal electrode may extend to the third and fourth surfaces of the body. The first external electrode may cover the fifth and sixth surfaces of the body, and the second external electrode may cover the third and fourth surfaces of the body.

According to an aspect of the present disclosure, an electronic component includes a body including a dielectric layer and an internal electrode, and an external electrode disposed on the body, connected to the internal electrode, and including a low-reflection layer. A brightness value of HSV measured in an image of a surface of the low-reflection layer is 45% or less.

According to an aspect of the present disclosure, a substrate with an electronic component embedded therein includes an insulating layer, a circuit layer, and an electronic component connected to the circuit layer. The electronic component includes a body including a dielectric layer and an internal electrode, and an external electrode disposed on the body, connected to the internal electrode and including a low-reflection layer, and brightness of a surface of the low-reflection layer is lower than brightness of a surface of the body.

According to an aspect of the present disclosure, an electronic component includes: a body including a dielectric layer and an internal electrode; and an external electrode disposed on the body, connected to the internal electrode, and including a Ni—Zn-based material as an outermost portion of the external electrode.

A thickness of the Ni—Zn-based material may be 5 μm or more.

The Ni—Zn-based material may further include S.

The Ni—Zn-based material may include needle-shaped particles.

The needle-shaped particles may contain at least one of Na and Cl.

The Ni—Zn-based material may include an Ni—Zn alloy.

The Ni—Zn-based material may be directly connected to the internal electrode.

The external electrode may further include a base layer disposed between the body and the Ni—Zn-based material.

According to an aspect of the present disclosure, an electronic component includes: a body including a dielectric layer and an internal electrode; and an external electrode disposed on the body, connected to the internal electrode, and including a layer including Ni particles and an oxide film disposed on surfaces of the Ni particles as an outermost layer of the external electrode.

The layer may further include an insulator in which the Ni particles are dispersed.

The Ni particles may include at least one particle being in contact with the insulator and the oxide film.

The layer including the Ni particles and the oxide film may be directly connected to the internal electrode.

The external electrode may further include a base layer disposed between the body and the layer including the Ni particles and the oxide film.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
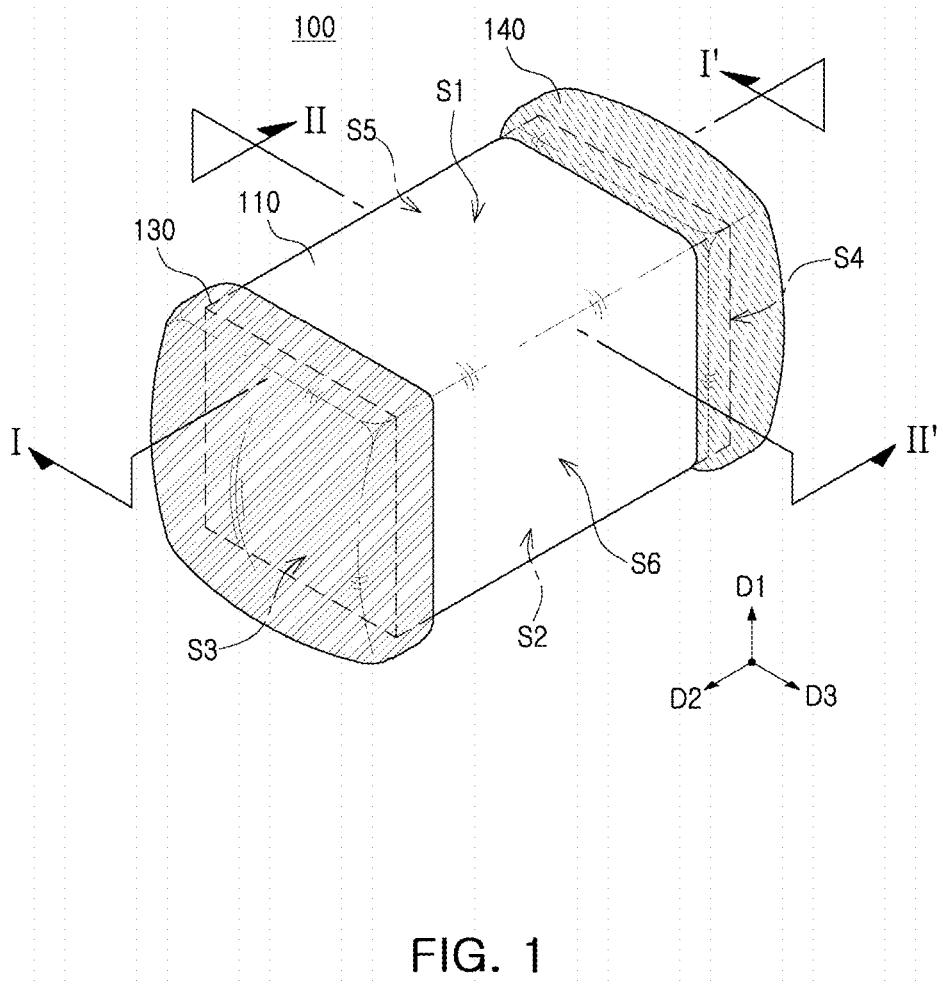
FIG. 1 is a perspective view schematically illustrating the appearance of an electronic component according to an embodiment.

Hereinafter, embodiments will be described with reference to detailed embodiments and accompanying drawings. However, the embodiments of the present disclosure may be modified in many different forms, and the scope of the present disclosure is not limited to the embodiments described below. In addition, the embodiments of the present disclosure are provided to more completely describe the present disclosure to those skilled in the art. Therefore, the shape and size of elements in the drawings may be exaggerated for clearer explanation, and elements indicated by the same reference numerals in the drawings are the same elements.

To clearly describe the present disclosure in the drawings, parts not relevant to the description are omitted, and the thickness is enlarged to clearly express the various layers and regions, and components with the same function within the scope of the same idea are described using the same reference numeral. Furthermore, throughout the specification, when a part is said to "include" a certain element, this does not mean that other components are excluded, but that other components may be further included, unless specifically stated to the contrary.

Figure 2:
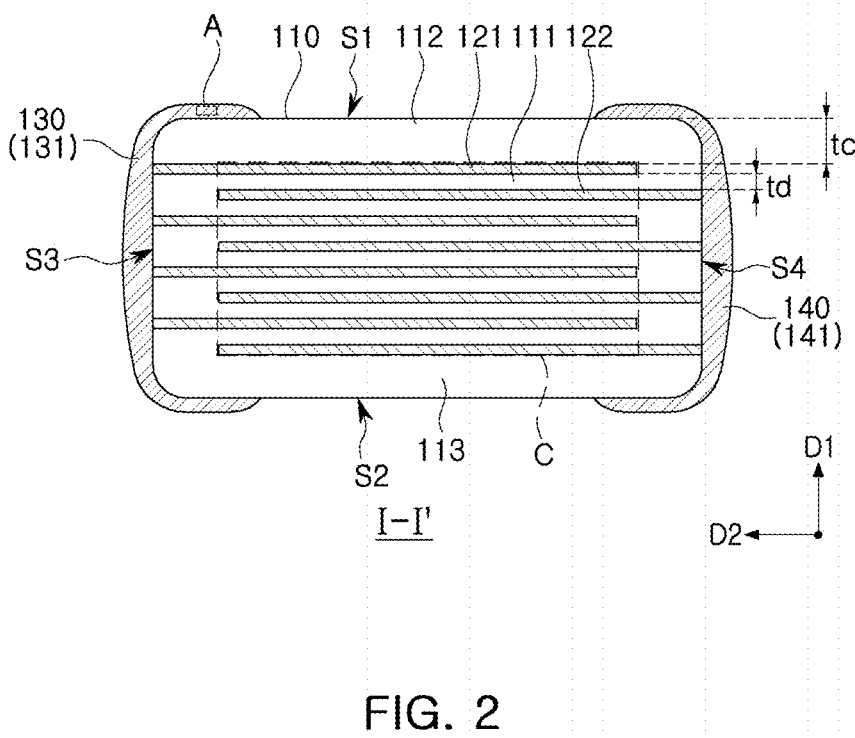
FIG. 2 is a cross-sectional view taken along line I-I' of FIG. 1.
Figure 3:
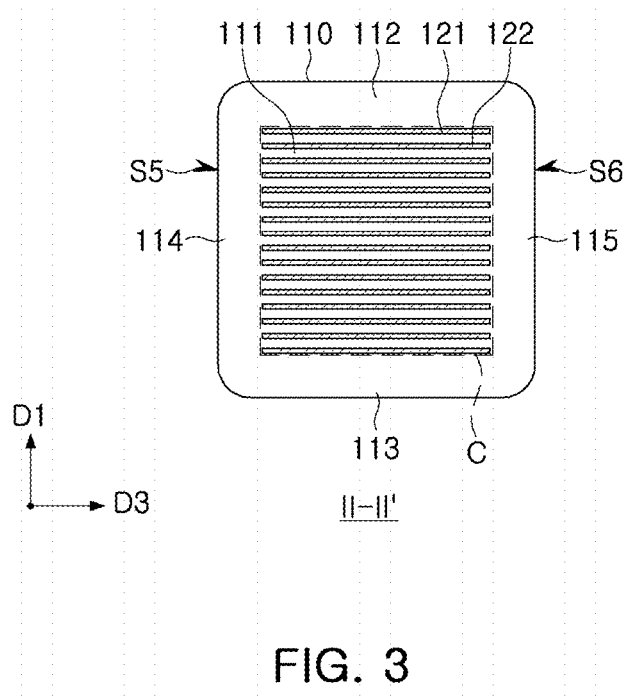
FIG. 3 is a cross-sectional view taken along line II-II' of FIG. 1.
Figure 4:
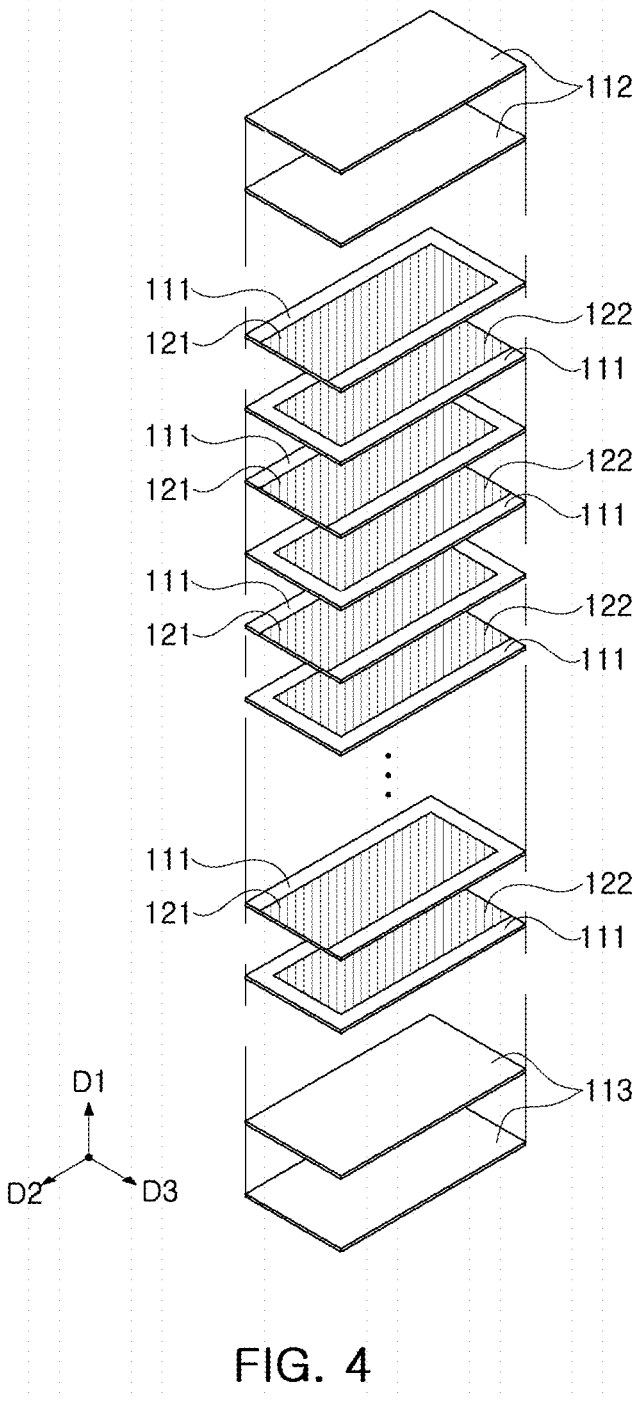
FIG. 4 is an exploded perspective view illustrating a body that may be used in the electronic component of FIG. 1.

FIG. 1 is a perspective view schematically illustrating the appearance of an electronic component according to a first embodiment. FIGS. 2 and 3 are section views taken along lines I-I' and II-II' of FIG. 1, respectively. FIG. 4 is an exploded perspective view illustrating a body that may be employed in the electronic component of FIG. 1.

Referring to FIGS. 1 to 4, an electronic component 100 according to an embodiment includes a body 110, and external electrodes 130 and 140 including low-reflection layers 131 and 141, as main components, and in this case, the brightness of the surface of the low-reflection layers 131 and 141 is lower than the brightness of the surface of the body 110. In addition to the relative comparison conditions of brightness, the brightness value of Hue Saturation Value (HSV) measured in an image of the surface of the low-reflection layers 131 and 141 may be defined as 45% or less. As in this embodiment, light energy reflection from the external electrode 130 may be reduced by employing the low-reflection layers 131 and 141 in the external electrode 130. When embedding this electronic component 100 in a circuit board or the like, the problem of deterioration of the electronic component 100 in hole processing precision due to reflection of light energy may be reduced when performing laser processing to form a via hole connected to the electronic component 100. As a result, the connectivity between the electronic component 100 and the conductive via (205 in FIG. 20) may be improved. Details about the low-reflection layers 131 and 141 will be described later. On the other hand, in this embodiment, a multilayer capacitor, for example, a multilayer ceramic capacitor, is used as an example of the electronic component 100, but in addition thereto, various parts that may be embedded in a circuit board, such as other types of parts, such as thin film capacitors, coil parts, and resistor parts, and the like, may be used.

The body 110 includes a dielectric layer 111 and internal electrodes 121 and 122 alternately disposed with the dielectric layer 111, and in this case, the internal electrodes 121 and 122 may include a first internal electrode 121 and a second internal electrode 122. There is no particular limitation on a detailed shape of the body 110, but as illustrated, the body 110 may have a hexahedral shape or a shape similar thereto. Due to shrinkage of the ceramic powder included in the body 110 during a sintering process, the body 110 may not have a hexahedral shape with completely straight lines, but may have a substantially hexahedral shape. When the direction in which the dielectric layer 111 and the internal electrodes 121 and 122 are stacked is referred to as a first direction D1, the body 110 may include first and second surfaces S1 and S2 opposing each other in the first direction D1. Additionally, the body 110 may include a third surface S3 and a fourth surface S4 located between the first surface S1 and the second surface S2 and opposing in the second direction D2, and a fifth surface S5 and a sixth surface S6 located between the first surface S1 and the second surface S2 and opposing in the third direction D3.

The plurality of dielectric layers 111 forming the body 110 are in a sintered state, and the boundaries between adjacent dielectric layers 111 may be integrated to the extent that it is difficult to check without using a scanning electron microscope (SEM). The raw material forming the dielectric layer 111 is not particularly limited as long as sufficient capacitance may be obtained. For example, barium titanate-based materials, lead composite perovskite-based materials, strontium titanate-based materials, or the like may be used. The barium titanate-based material may include $BaTiO_3$-based ceramic powder, and as an example of the ceramic powder, there may be provided $BaTiO_3$, $(Ba_{1-x}Ca_x)TiO_3$ ($0<x<1$), $Ba(Ti_{1-y}Ca_y)O_3$ ($0<y<1$), $(Ba_{1-x}Ca_x)(Ti_{1-y}Zr_y)O_3$ ($0<x<1$, $0<y<1$), $Ba(Ti_{1-y}Zr_y)O_3$ ($0<y<1$), or the like, in which calcium (Ca), zirconium (Zr) and the like are partially dissolved in $BaTiO_3$, and the like. In addition, as the raw material forming the dielectric layer 111, various ceramic additives, organic solvents, binders, dispersants, and the like may be added to powder such as barium titanate ($BaTiO_3$) according to the purpose of the present disclosure.

On the other hand, the average thickness (td) of the dielectric layer 111 does not need to be particularly limited. For example, the average thickness (td) of the dielectric layer 111 may be 0.2 μm or more and 2 μm or less, and to more easily obtain high capacitance and miniaturization of the electronic component 100, the average thickness (td) of the dielectric layer 111 may be 0.35 μm or less. The average thickness (td) of the dielectric layer 111 may refer to the average thickness (td) of the dielectric layer 111 disposed between the first and second internal electrodes 121 and 122. The average thickness (td) of the dielectric layer 111 may be measured by scanning an image of the cross-section of the body 110 in the first direction D1 and the second direction D2 using a scanning electron microscope (SEM) at 10,000 magnification. In more detail, the average value may be measured by measuring the thickness of one dielectric layer at 30 points at equal intervals in the length direction of the scanned image. The 30 equally spaced points may be designated in a capacitance forming portion C. Additionally, by extending this average value measurement to 10 dielectric layers and measuring the average value, the average thickness of the dielectric layer may be further generalized.

Referring to FIG. 2, the body 110 may include the capacitance forming portion C disposed inside the body 110 and including the first internal electrodes 121 and the second internal electrodes 122 alternately disposed with the dielectric layer 111 interposed therebetween, and cover portions 112 and 113 disposed on one surface and the other surface of the capacitance forming portion C in the first direction D1. In addition, the capacitance forming portion C is a part that contributes to forming the capacitance of the capacitor, and may be formed by repeatedly stacking a plurality of first and second internal electrodes 121 and 122 with the dielectric layer 111 interposed therebetween. The cover portions 112 and 113 may be formed by stacking a single green sheet or two or more green sheets in the first direction on one surface and the other surface of the capacitance forming portion C in the first direction D1, respectively, and may serve to prevent damage to the internal electrode due to physical or chemical stress. Additionally, the cover portions 112 and 113 do not include internal electrodes and may include the same material as the dielectric layer 111. On the other hand, the average thickness of the cover portions 112 and 113 does not need to be particularly limited. However, to more easily obtain miniaturization and high capacitance of the multilayer electronic component, the average thickness (tc) of the cover portions 112 and 113 may be 15 μm or less. The average thickness (tc) of the cover portions 112 and 113 may refer to the length in the first direction D1, and may be an average of the lengths of the cover portions 112 and 113 in the first direction D1 measured at five points at equal intervals on the upper or lower portion of the capacitance forming portion C.

Referring to FIG. 3, margin portions 114 and 115 may be disposed on one surface and the other surface of the capacitance forming portion C in the third direction D3. As illustrated, the margin portions 114 and 115 may refer to an area between both ends of the first and second internal electrodes 121 and 122 and the boundary surface of the body 110. The margin portions 114 and 115 may basically serve to prevent damage to the internal electrodes due to physical or chemical stress. By forming internal electrodes by applying conductive paste to a ceramic green sheet except for areas in which the margin portion is to be formed, the margin portions 114 and 115 may be provided. The width of the margin portions 114 and 115 does not need to be particularly limited. However, to more easily obtain miniaturization and high capacitance of the multilayer electronic component, the average width of the margin portions 114 and 115 may be 15 μm or less. The average width of the margin portions 114 and 115 may refer to an average value of the length of the margin portions 114 and 115 in the third direction (D3), and may be an average value of the lengths of the margin portions 114 and 115 in the third direction, measured at five points at equal intervals on the side surface of the capacitance forming portion C.

The internal electrodes 121 and 122 are alternately disposed with the dielectric layer 111 in the first direction D1. The internal electrodes 121 and 122 may include first and second internal electrodes 121 and 122. The first and second internal electrodes 121 and 122 are alternately disposed to face each other with the dielectric layer 111 interposed therebetween to constitute the body 110, and may extend to the third and fourth surfaces S3 and S4 of the body 110, respectively. In detail, as illustrated in FIG. 2, the first internal electrode 121 is spaced apart from the fourth surface S4 and is exposed through the third surface S3, and the second internal electrode 122 is spaced apart from the third surface S3 and may be exposed through the fourth surface S4. A first external electrode 130 may be disposed on the third surface S3 of the body 110 and connected to the first internal electrode 121, and a second external electrode 140 may be disposed on the fourth surface S4 of the body 110 and connected to the second internal electrode 122. For example, the first internal electrode 121 is not connected to the second external electrode 140, but is connected to the first external electrode 130, and the second internal electrode 122 is not connected to the first external electrode 130, but is connected to the second external electrode 140. Accordingly, the first internal electrode 121 may be formed at a certain distance from the fourth surface S4, and the second internal electrode 122 may be formed at a certain distance from the third surface S3. At this time, the first and second internal electrodes 121 and 122 may be electrically separated from each other by the dielectric layer 111 disposed therebetween.

The material forming the internal electrodes 121 and 122 is not particularly limited, and any material with excellent electrical conductivity may be used. For example, the internal electrodes 121 and 122 may include at least one of nickel (Ni), copper (Cu), palladium (Pd), silver (Ag), gold (Au), platinum (Pt), tin (Sn), tungsten (W), titanium (Ti) and alloys thereof. Additionally, the internal electrodes 121 and 122 may be formed by printing a conductive paste for internal electrodes, containing at least one of nickel (Ni), copper (Cu), palladium (Pd), silver (Ag), gold (Au), platinum (Pt), tin (Sn), tungsten (W), titanium (Ti) and alloys thereof, on a ceramic green sheet. The printing method for the conductive paste for internal electrodes may be screen printing or gravure printing, but the present disclosure is not limited thereto.

The external electrodes 130 and 140 are disposed on the body 110 and may include first and second external electrodes 130 and 140 respectively connected to the internal electrodes 121 and 122. In this case, as illustrated, the first and second internal electrodes 121 and 122 extend to the third surface S3 and the fourth surface S4 of the body 110, respectively, and the first and second external electrodes 130 and 140 are disposed on the third surface S3 and the fourth surface S4 of the body 110, respectively, and may have a form extending to the first surface S1 and the second surface S2 of the body 110. In the case of this embodiment, the external electrodes 130 and 140 include low-reflection layers 131 and 141 having a lower level of surface brightness than in the related art. In this case, the low-reflection layers 131 and 141 may be disposed on the outermost side of the external electrodes 130 and 140. In the related art, when forming a via hole in the insulating layer of a circuit board using a laser or the like, a phenomenon occurs in which the absorption of laser energy is interrupted in the area of the insulating layer adjacent to the external electrode due to reflection of light energy from the external electrode, and thus, it is difficult to precisely process the shape or size of the via hole.

Figure 5:
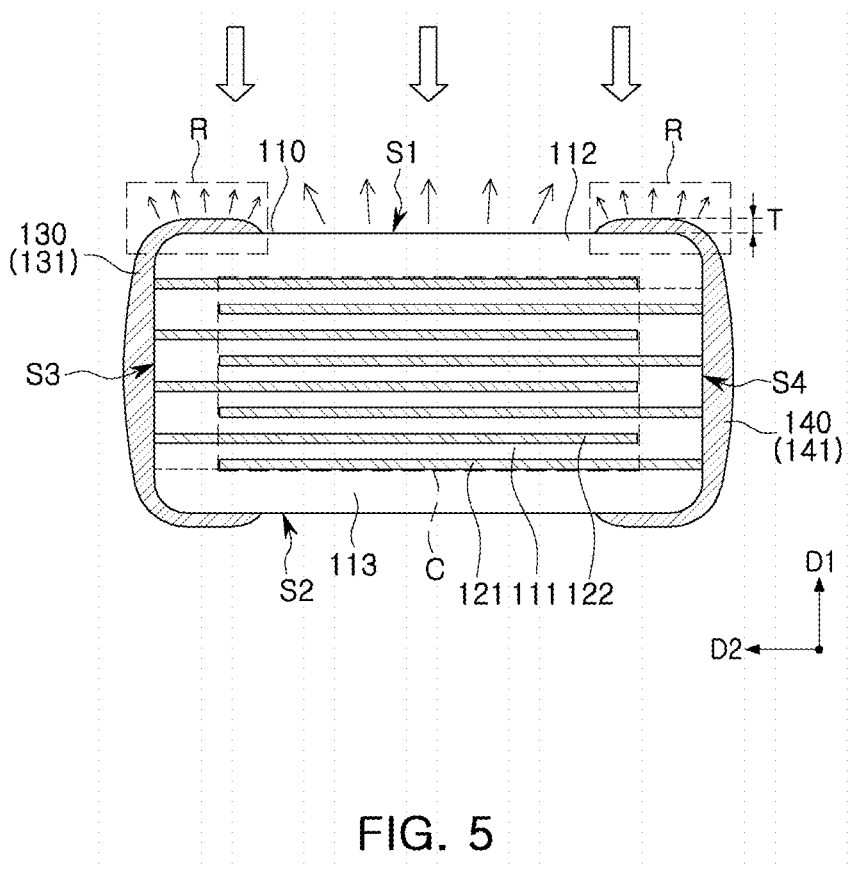
FIG. 5 illustrates an example in which white light is irradiated to the electronic component of FIG. 1.
Figure 6:
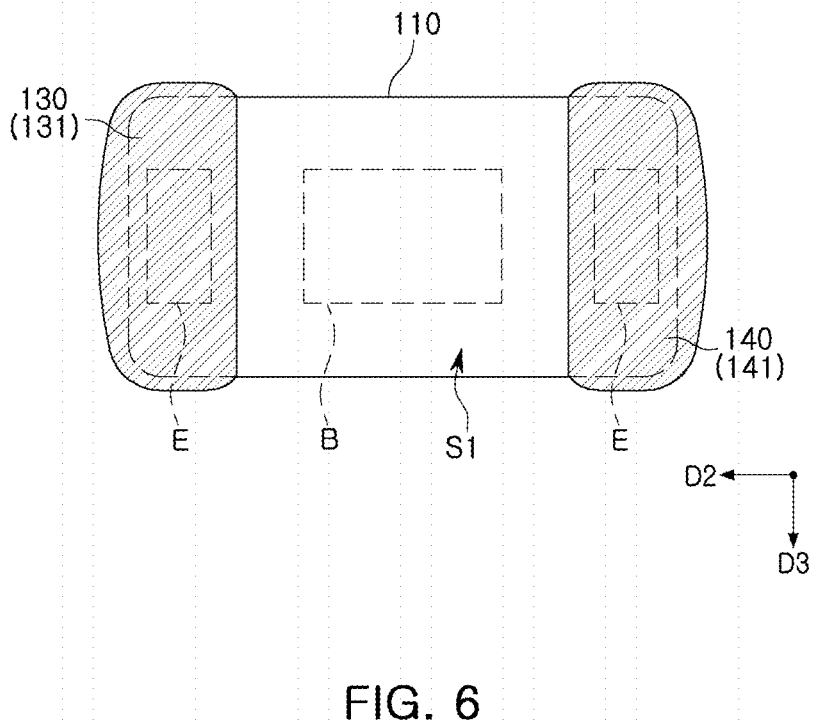
FIG. 6 is a plan view of the electronic component of FIG. 1 viewed from one direction.

In this embodiment, by using the external electrodes 130 and 140 having low-reflection layers 131 and 141 with low light reflectivity, processing precision of via holes may be improved when processing via holes in the insulating layer of a circuit board. To reduce light energy reflection during via hole processing, the low-reflection layers 131 and 141 have a relatively dark color, and for example, are formed to have relatively low brightness. In detail, the brightness of the surface of the low-reflection layers 131 and 141 is lower than the brightness of the surface of the body 110. The difference in surface brightness between the low-reflection layers 131 and 141 and the body 110 may be distinguishable when viewed with the naked eye in a general indoor or outdoor environment. However, if a standard for comparing brightness is presented in more detail, the brightness of the surface of the low-reflection layers 131 and 141 and the brightness of the surface of the body 110 may be based on the intensity of light reflected by irradiating white light on the surface, and in more detail, may be obtained by measuring the intensity of light reflected by irradiating white light from the same light source. In this case, as illustrated in FIGS. 5 and 6, the brightness of the surface of the body 110 may be measured on the first surface S1 of the body 110, and the brightness of the surface of the low-reflection layers 131 and 141 may be measured on the surface in the same direction thereas, for example, on the surface of the area disposed on the first surface S1 of the body 110. FIG. 5 schematically illustrates the form reflected by the body 110 and the low-reflection layers 131 and 141 when white light is irradiated toward the electronic component 100, and in this case, reflection of light energy occurs at a relatively low level in the low-reflection layers 131 and 141.

The surface brightness of the low-reflection layers 131 and 141 and the body 110 may be obtained by measuring the intensity of reflected light by irradiating white light from the same light source, and for example, the HSV brightness value may be obtained from an image obtained after the reflected light is received by the image sensor. In this case, to obtain the HSV brightness value of the image, an image processing or image viewer program known in the art, such as a GNU Image Manipulation Program (GIMP), an open source image editor, or the like may be used. The surface brightness of the low-reflection layers 131 and 141 and the body 110 may be obtained by a scanning device. For example, the electronic component 100 is disposed on an image scanner, such that the surface brightness of the surface of the electronic component 100 facing the light source, for example, the first surface S1 of the body 110 and the region of the low-reflection layers 131 and 141 disposed on the first surface S1 of the body 110 may be measured. In this case, as an example, to correct the surface brightness value, color>level>A4 white paper background may be specified as a white point in the GIMP described above. The brightness values of the outer areas of the surfaces of the low-reflection layers 131 and 141 and the body 110 may vary due to surrounding influences or the like, and thus, the target area for brightness measurement may be specified as the center area. For example, as illustrated in FIG. 6, the brightness of the surface of the low-reflection layer 131, 141 may be the average brightness of a rectangular area (E) including the center of the surface of the low-reflection layer 131, 141 and having a horizontal and vertical length of 30% to 60% of the horizontal and vertical length of the surface of the low-reflection layer 131, 141. For example, the brightness of the surface of the low-reflection layer 131, 141 may be the average brightness of a rectangular area (E) that includes the center of the surface of the low-reflection layer 131, 141 and has horizontal and vertical lengths that are respectively half of the horizontal and vertical lengths of the surface of the low-reflection layer 131, 141. Similarly, the brightness of the surface of the body 110 may be the average brightness of a rectangular area (B) that includes the center of the surface of the body 110 and has horizontal and vertical lengths that are respectively half of the horizontal and vertical lengths of the surface of the body 110. In this case, the area subject to brightness measurement in surface images of the body 110 and the low-reflection layers 131 and 141 obtained by the scanner may be designated using the selection tool of the image editor, and the brightness level may be confirmed with a histogram of the area.

On the other hand, a thickness T of the low-reflection layers 131 and 141 may be adjusted such that the low-reflection function of the low-reflection layers 131 and 141 may be effectively performed. In detail, the thickness T of the area of the low-reflection layers 131 and 141 disposed on the first surface S1 of the body 110 may be 5 μm or more, and in this case, the thickness T of the low-reflection layers 131 and 141 may be a maximum thickness.

For detailed examples of the surface brightness values of the low-reflection layers 131 and 141 and the body 110, first, the brightness value of HSV measured from the image of the surface of the low-reflection layers 131 and 141 may be 45% or less, or in case of being even lower, 40% or less and in more detail, 35% or less. In this case, the brightness value of HSV means black at 0% and white at 100%. The brightness of the surface of the body 110 may be higher than this, and in detail, the brightness value of HSV measured in the image of the surface of the body 100 may be greater than 45%. According to the research of the inventors of the present disclosure, when the brightness of the surface of the low-reflection layers 131 and 141 is as low as 45% or less based on the brightness value of HSV, precision may be improved during laser processing of a circuit board including the electronic component 100 embedded therein, compared to the related art method.

Figure 7:
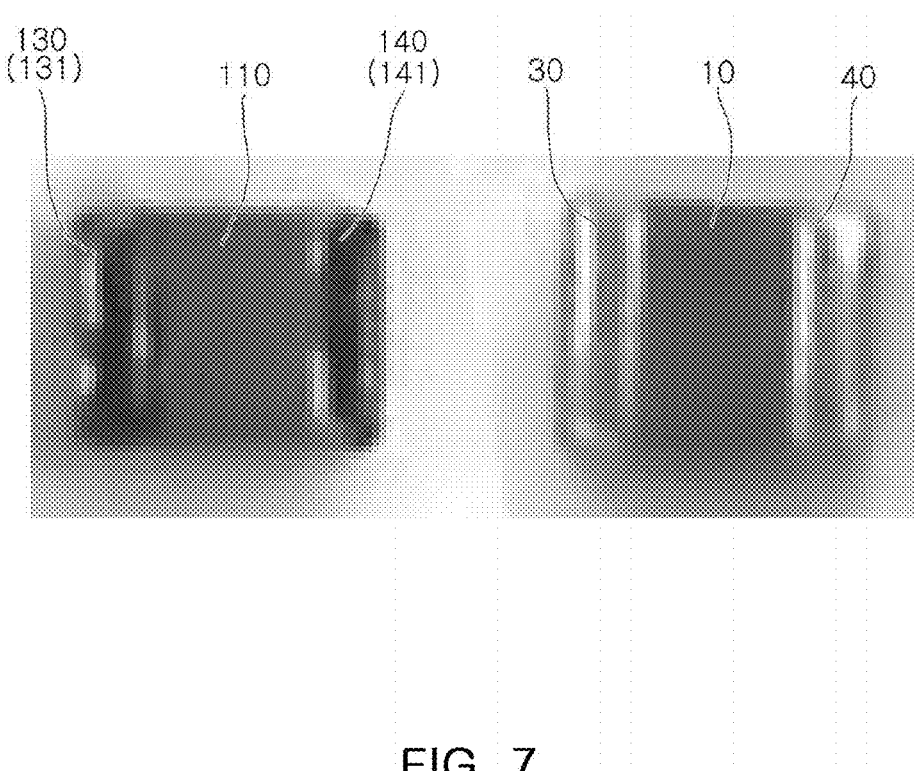
FIG. 7 illustrates comparison of the brightness after irradiating white light to electronic components according to an example and a comparative example.

FIG. 7 illustrates comparison of the brightness after irradiating white light to electronic components according to an example (left) of the present disclosure and a comparative example (right). In the case of the example, the low-reflection layers 131 and 141 were formed with a Ni—Zn—S-based plating layer. In Comparative Example 1, external electrodes 30 and 40 were formed with an Ni/Sn plating layer as an outermost layer, and in Comparative Example 2, external electrodes 30 and 40 were formed with a Cu electrode layer as an outermost layer, which is used as an electrode of a capacitor embedded in a substrate of the related art. These electronic components were put into the scanner, disposed adjacently to each other, and then surface scanned at 300 dpi, thereby obtaining surface images using GIMP that is the image processing software. In this case, the brightness of the surfaces of the low-reflection layers 131 and 141 was measured in rectangular areas A that include the centers of the surfaces of the low-reflection layers 131 and 141 and have 36% of the horizontal lengths and 60% of the vertical lengths of the surfaces of the low-reflection layers 131 and 141. Additionally, the brightness of the surface of the body 110 was measured in a rectangular area (B) that includes the center of the surface of the body 110 and has horizontal and vertical lengths that are respectively half of the horizontal and vertical lengths of the surface of the body 110. As described above, the surface brightness of respective areas is based on the HSV brightness value. In the example, the HSV brightness value in the surface images of the low-reflection layers 131 and 141 averaged about 30.8%, and the standard deviation was 1.9%. In Comparative Example 1, the brightness value of HSV in the surface images of the external electrodes 30 and 40 averaged about 73% and the standard deviation was 3.8%. In Comparative Example 2, the brightness value of HSV in the surface images of the external electrodes 30 and 40 was the highest at an average of about 80.8%, and the standard deviation was 1.6%. There was no significant difference in the surface brightness of the bodies 110 and 10 in the example and comparative examples, and the HSV brightness value averaged about 48.2% to 51.5%.

Figure 8:
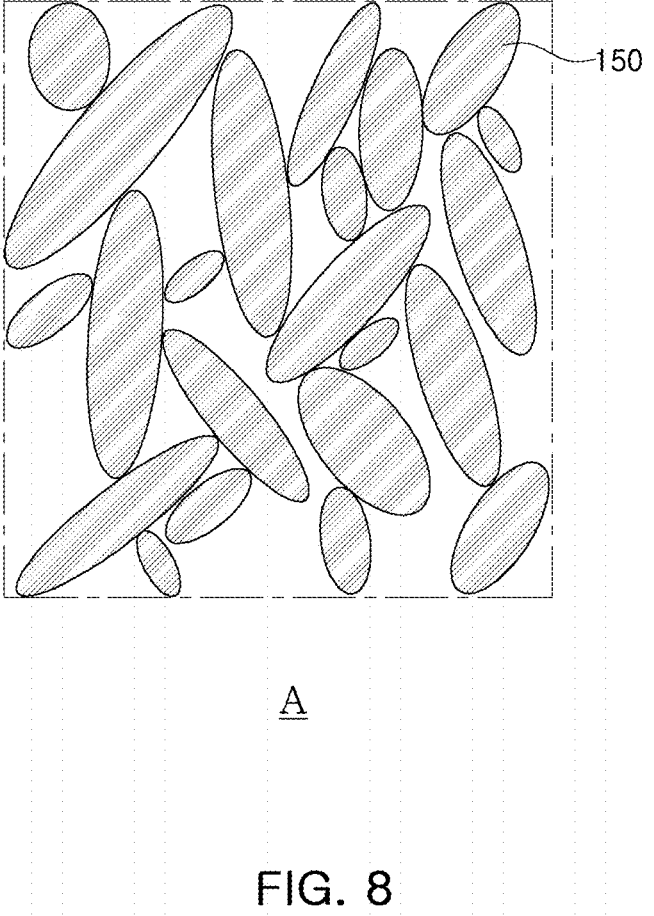
FIG. 8 is an enlarged view of an area of a low-reflection layer that may be used in the electronic component of FIG. 1.
Figure 9:
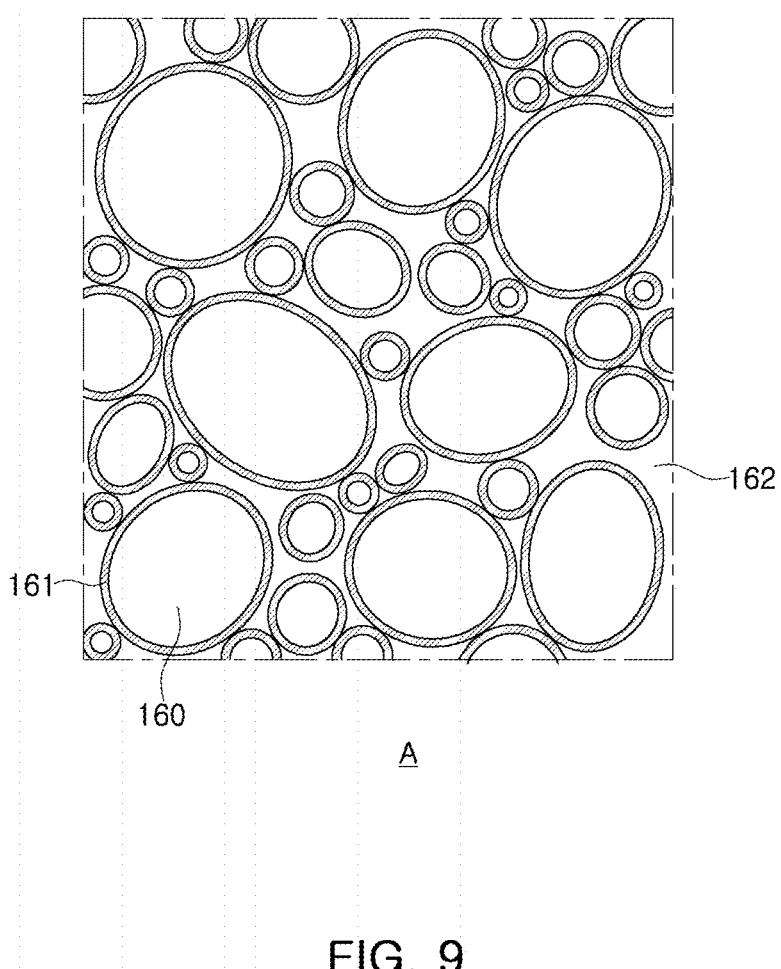
FIG. 9 illustrates an enlarged view of an area of a low-reflection layer that may be employed in the electronic component of FIG. 1.
Figure 10:
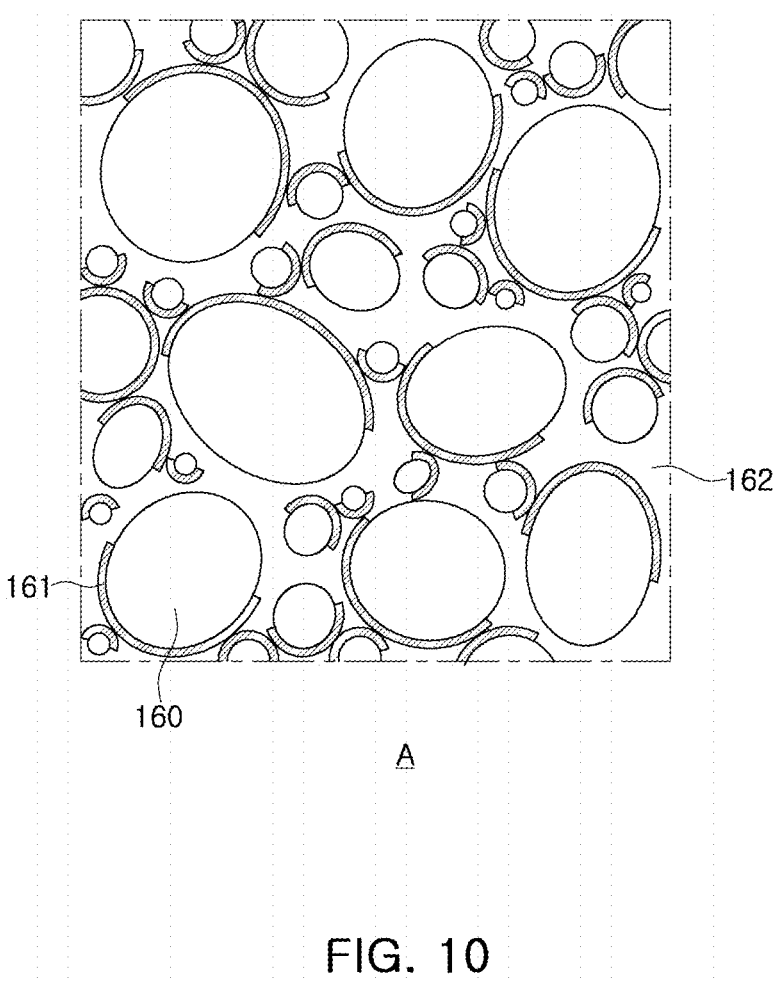
FIG. 10 is an enlarged view of an area of a low-reflection layer that may be used in the electronic component of FIG. 1.

Detailed examples of the low-reflection layer will be described from a structural aspect with reference to FIGS. 8 to 10. FIGS. 8 to 10 are enlarged views of a region of a low-reflection layer that may be used in the electronic component of FIG. 1. To have relatively low reflectivity to white light, the low-reflection layers 131 and 141 may include a plating layer containing Ni, and as a more detailed example, the low-reflection layers 131 and 141 may include a Ni—Zn-based material. Additionally, the Ni—Zn-based material may further include sulfur (S). When plating using a plating solution containing components such as Ni, Zn, and S, the low-reflection layers 131 and 141 may contain nickel sulfide, Ni metal, Zn metal, and the like, and may have a relatively dark color, for example, black or a color close to black. As another example, as illustrated in FIG. 8, the plating layer included in the low-reflection layers 131 and 141 may include needle-shaped particles 150. In this case, needle-shaped means that the major axis is longer than the minor axis of the particle, and for example, may refer to a shape in which the major axis length is twice or more than the minor axis length. When the low-reflection layers 131 and 141 include needle-shaped particles 150, light incident from one side spreads in a random direction rather than being reflected in the direction of the light source, which may lower the surface brightness of the low-reflection layers 131 and 141. According to the present inventors' research, needle-shaped particles 150 may be obtained by causing structural changes during Ni plating, and for example, needle-shaped particles 150 may be obtained when plating is performed after adding NaCl to the NiCl plating solution. Accordingly, even trace amounts of Na and Cl among the plating solution components may remain, and in this case, the needle-shaped particles 150 may contain at least one of Na and Cl.

As another example, as in the form illustrated in FIG. 9, the low-reflection layers 131 and 141 may include metal particles 160 and an oxide film 161 formed on the surfaces of the metal particles 160. The oxide film 161 formed on the surface of the metal particle 160 has high surface roughness and may have a dark color due to relatively low light reflectivity. In this case, the metal particles 160 may include Ni, and the oxide film 161 may include $Ni_2O_3$. Additionally, in addition to the metal particles 160, the low-reflection layers 131 and 141 may further include an insulator 162 in which the metal particles 160 are dispersed. In this case, the insulator 162 may include a resin component. In this case, the low-reflection layers 131 and 141 may be formed by dispersing the metal particles 160 having the oxide film 161 in the insulator 162 such as epoxy resin or the like to form a paste, and then drying and curing the paste. In addition, the oxide film 161 may be formed by forming the metal particles 160 using a method such as plating and then oxidizing the surface. As illustrated in the drawings, the oxide film 161 is formed with a thin thickness compared to the size of the metal particles 160, and thus, may not have a significant effect on the electrical conductivity of the low-reflection layers 131 and 141. However, depending on an embodiment, a portion of the oxide film 161 may be removed from at least some areas of the low-reflection layers 131 and 141 to expose the metal particles 160, as illustrated in FIG. 10, and as a result, the electrical conductivity of the low-reflection layers 131 and 141 may be improved. In this case, the oxide film 161 may be removed by heat generated by irradiation of a laser or the like during the above-described via hole processing process (see FIG. 21).

In addition to the structure or method described above, the low-reflection layers 131 and 141 may also be implemented by a sputtering process. As a detailed example, the low-reflection layers 131 and 141 may include a Ni sputtering layer, and in this case, the Ni sputtering layer may include Ni—Zn alloy. The low-reflection layers 131 and 141 obtained by the sputtering process have high surface roughness and may have a dark color due to relatively low light reflectivity.

Figure 11:
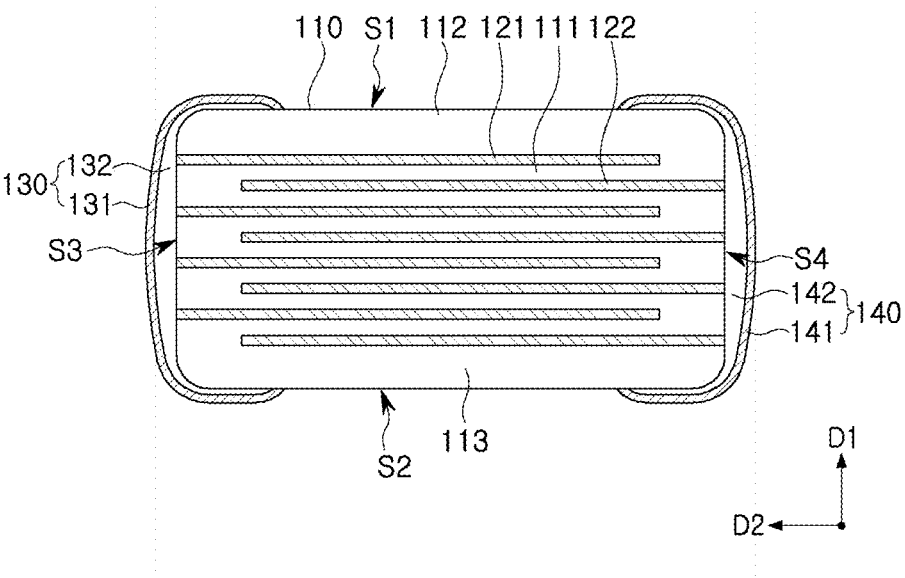
FIG. 11 is a cross-sectional view of an electronic component with a modified external electrode.
Figure 12:
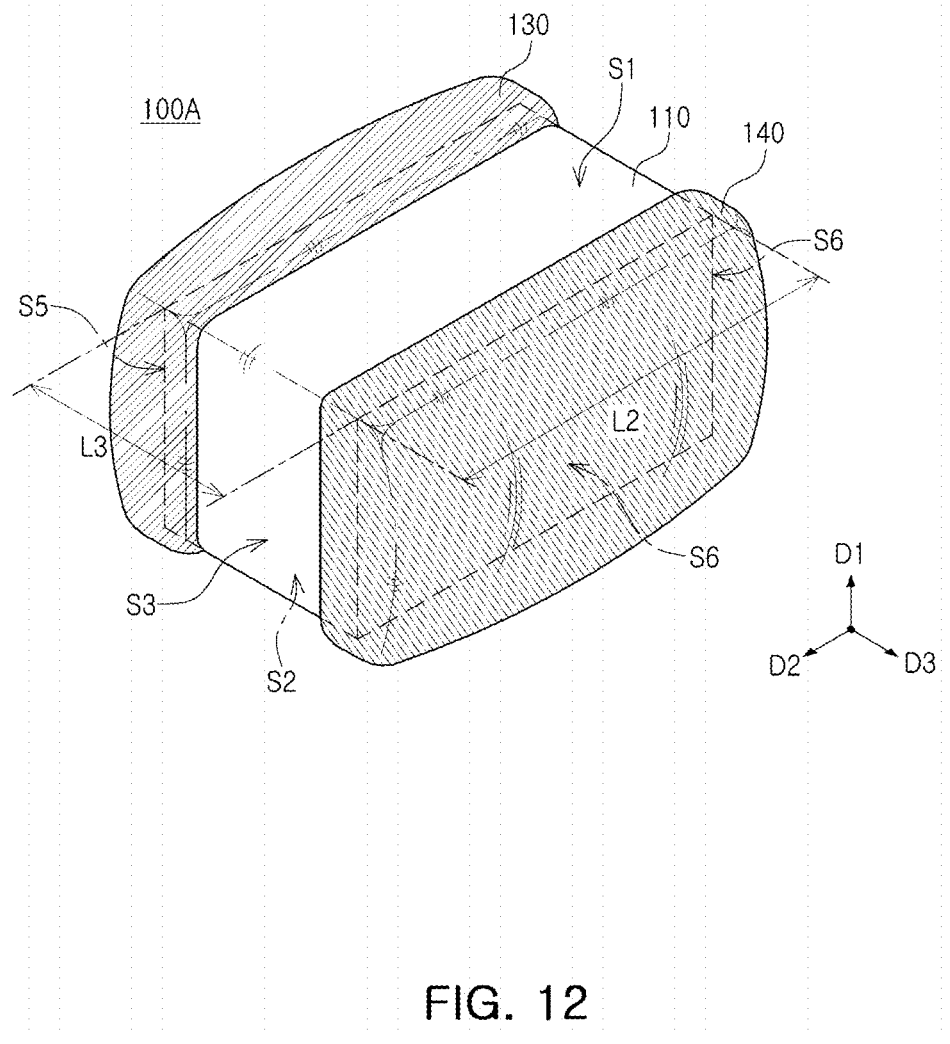
FIG. 12 is a perspective view schematically illustrating the appearance of an electronic component according to a second embodiment.
Figure 13:
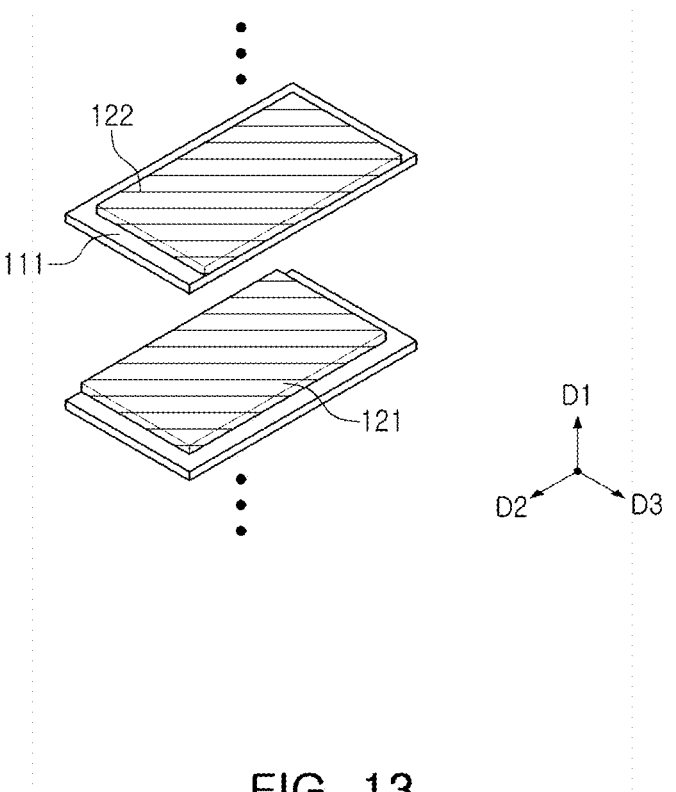
FIG. 13 is an exploded perspective view illustrating a body that may be used in the electronic component of FIG. 12.

On the other hand, the low-reflection layers 131 and 141 may be directly connected to the internal electrodes 121 and 122 as illustrated in FIG. 2. For example, no other electrode layer may be present between the body 110 and the low-reflection layers 131 and 141. Alternatively, as in the modified example of FIG. 11, the external electrodes 130 and 140 may further include base layers 132 and 142 disposed between the body 110 and the low-reflection layers 131 and 141. In this case, the base layers 132 and 142 may include at least one of Pd and Cu. The base layers 132 and 142 may function as seed layers for forming the low-reflection layers 131 and 141. In detail, In the case in which the base layers 132 and 142 are formed using Pd, the base layers 132 and 142 may be thin and have high electrical conductivity. The modified example of FIG. 11 may also be employed in the following embodiments.

With reference to FIGS. 12 to 19, various types of electronic components will be described focusing on differences from the previous embodiment. In the following embodiments, the external electrodes 130 and 140 include low-reflection layers 131 and 141 with relatively low surface brightness, and redundant description thereof will be omitted. First, referring to FIGS. 12 and 13, in the case of an electronic component 100A according to a second embodiment, the first and second internal electrodes 121 and 122 extend to the fifth surface S5 and the sixth surface S6 of the body 110, respectively, and the first and second external electrodes 130 and 140 are disposed on the fifth surface S5 and the sixth surface S6 of the body 110, respectively. In this case, unlike the previous embodiment, a second direction length L2 of the body 110 is longer than a third direction length L3. This structure corresponds to the so-called Low Inductance Chip Capacitor (LICC).

Figure 14:
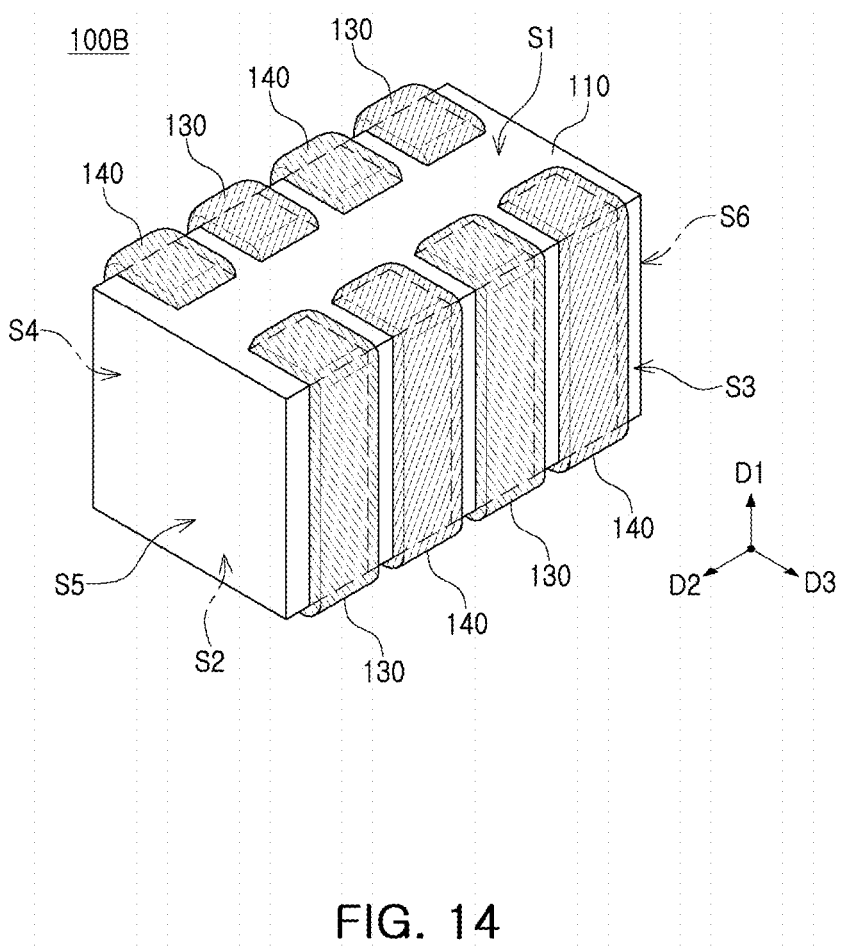
FIG. 14 is a perspective view schematically illustrating the appearance of an electronic component according to a third embodiment.
Figure 15:
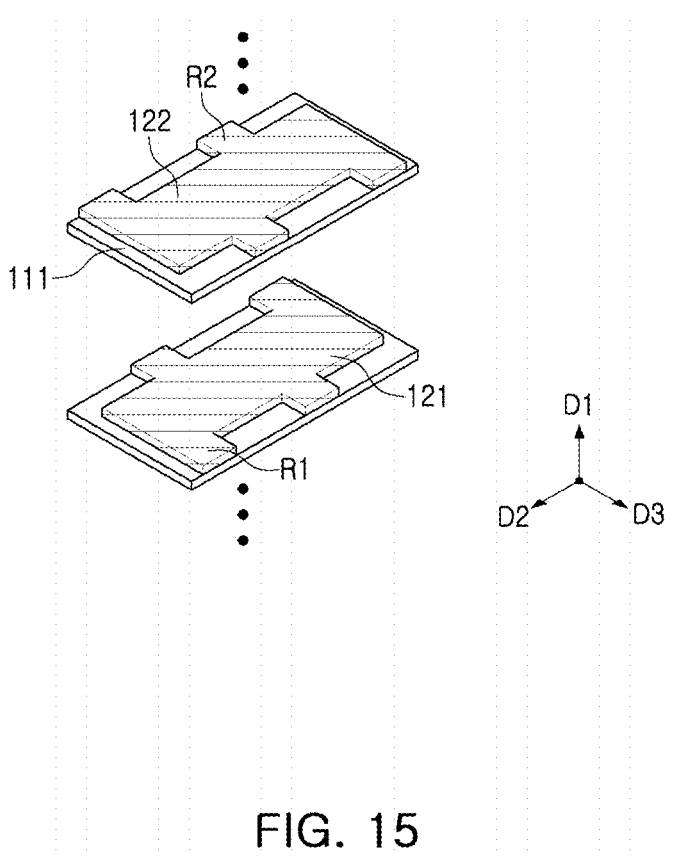
FIG. 15 is an exploded perspective view illustrating a body that may be used in the electronic component of FIG. 14.

Next, referring to FIGS. 14 and 15, an electronic component 100B according to a third embodiment corresponds to an 8-terminal structure. In detail, a first internal electrode 121 extends to the third surface S3 and the fourth surface S4 of the body 110, and a second internal electrode 122 extends to the third surface S3 and the fourth surface S4 of the body 110. First and second external electrodes 130 and 140 are alternately disposed on the third surface S3 and the fourth surface S4 of the body 110 in the third direction D3. In this case, the first internal electrode 121 may be connected to the first external electrode 130 through a first lead R1, and the second internal electrode 122 may be connected to the second external electrode 140 through a second lead R2.

Figure 16:
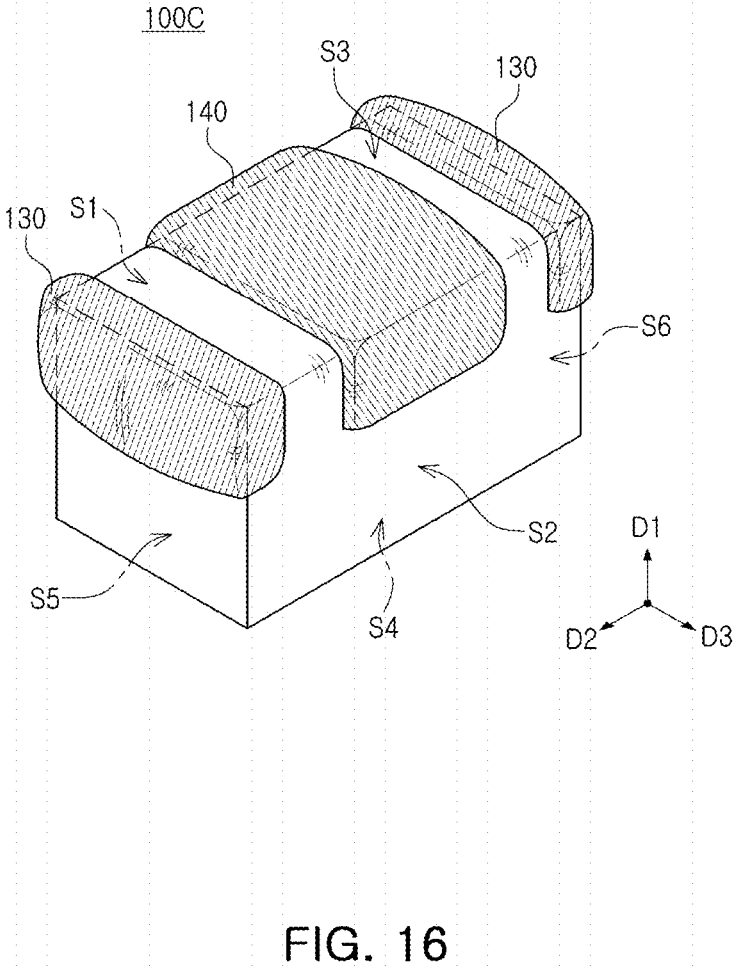
FIG. 16 is a perspective view schematically illustrating the appearance of an electronic component according to a fourth embodiment.
Figure 17:
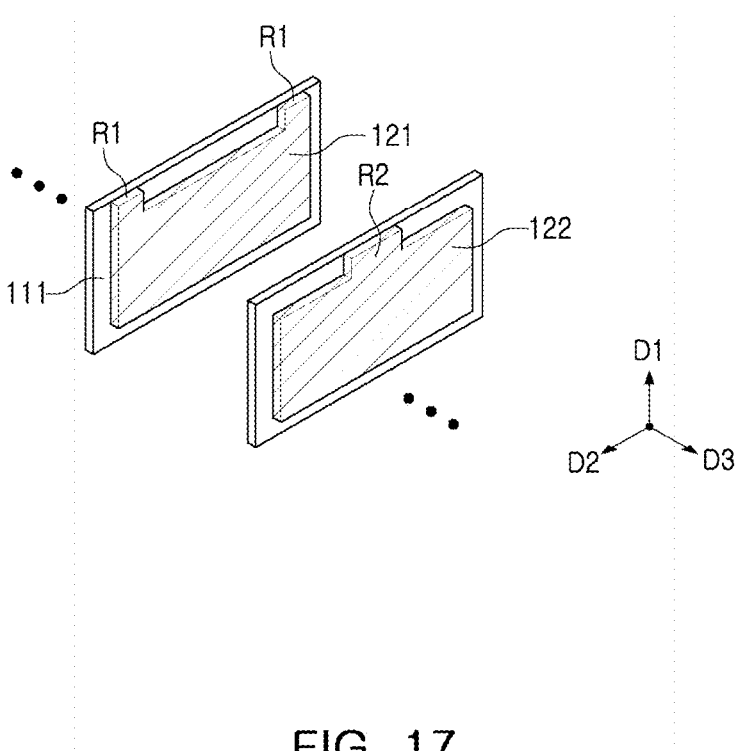
FIG. 17 is an exploded perspective view of a body that may be used in the electronic component of FIG. 16.

Next, referring to FIGS. 16 and 17, an electronic component 100C according to a fourth embodiment corresponds to a vertically laminated capacitor in which the internal electrodes 121 and 122 are disposed in a vertical direction with respect to the fourth surface S4 and the third surface S3 of the body 110 on which external electrodes 130 and 140 are disposed. In detail, the first internal electrode 121 extends to the third surface S3 of the body 110, and the second internal electrode 122 extends to the third surface S3 of the body 110. In this case, the first and second external electrodes 130 and 140 are disposed on the third surface S3 of the body 110. Additionally, the first external electrode 130 may be provided as a plurality of first external electrodes 130, and the second external electrode 140 may be disposed between the plurality of first external electrodes 130 based on the second direction D2. In this case, the first internal electrode 121 may be connected to the first external electrode 130 through the first lead R1, and the second internal electrode 122 may be connected to the second external electrode 140 through a second lead R2. Additionally, as illustrated, the first and second external electrodes 130 and 140 may not be formed on the fourth surface S4 of the body 110. Furthermore, although not shown in the drawings, the first and second external electrodes 130 and 140 may not be formed on the fifth surface S5 and the sixth surface S6 of the body 110.

Figure 18:
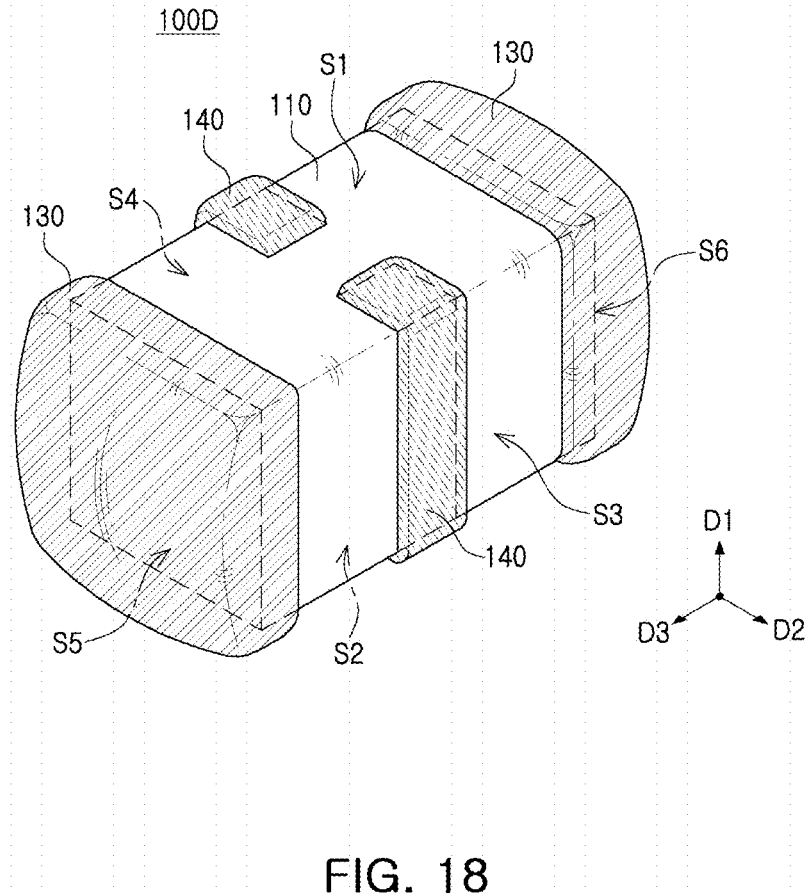
FIG. 18 is a perspective view schematically illustrating the appearance of an electronic component according to a fifth embodiment.
Figure 19:
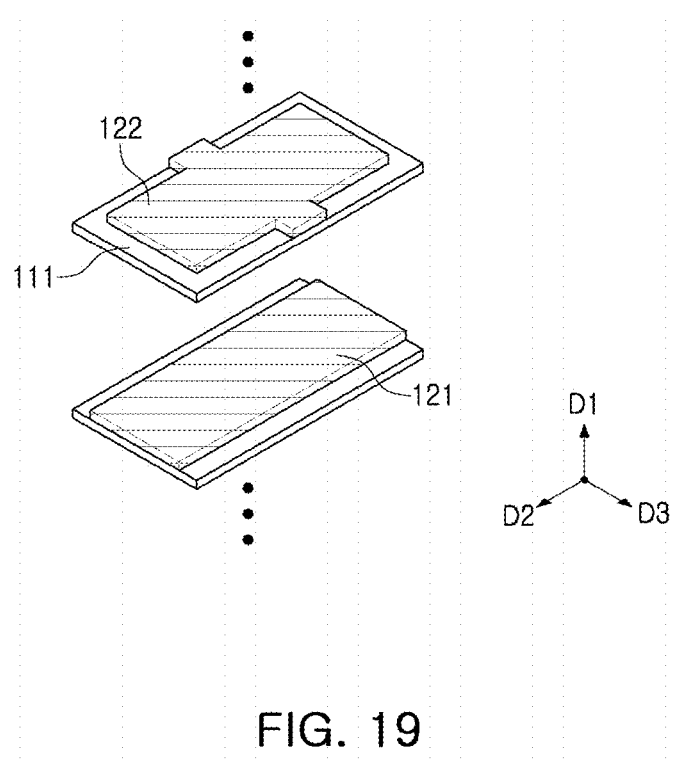
FIG. 19 is an exploded perspective view illustrating a body that may be used in the electronic component of FIG. 18.

Next, referring to FIGS. 18 and 19, in the case of an electronic component 100D according to a fifth embodiment, the first internal electrode 121 has a shape extending to the fifth surface S5 and the sixth surface S6 of the body 110, and the second internal electrode 122 has a shape extending to the third surface S3 and the fourth surface S4 of the body 110. The first external electrodes 130 are disposed on the fifth surface S5 and the sixth surface S6 of the body 110, and the second external electrode 140 is disposed on the third surface S3 and the fourth surface S4 of the body 110. When the electronic component 100D is disposed on a circuit board, the first external electrodes 130 may be connected to signal lines, and thus, the electronic component 100D may function as a three-terminal capacitor.

Figure 20:
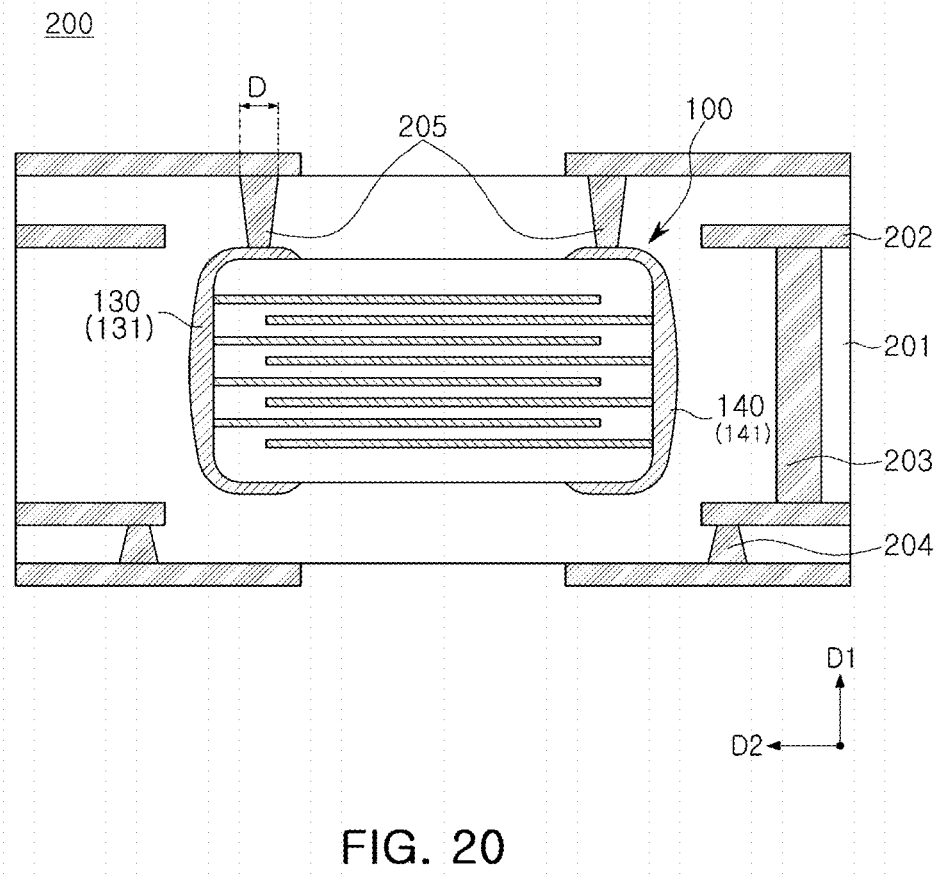
FIG. 20 is a cross-sectional view schematically illustrating a substrate with an electronic component embedded therein according to an embodiment.
Figure 21:
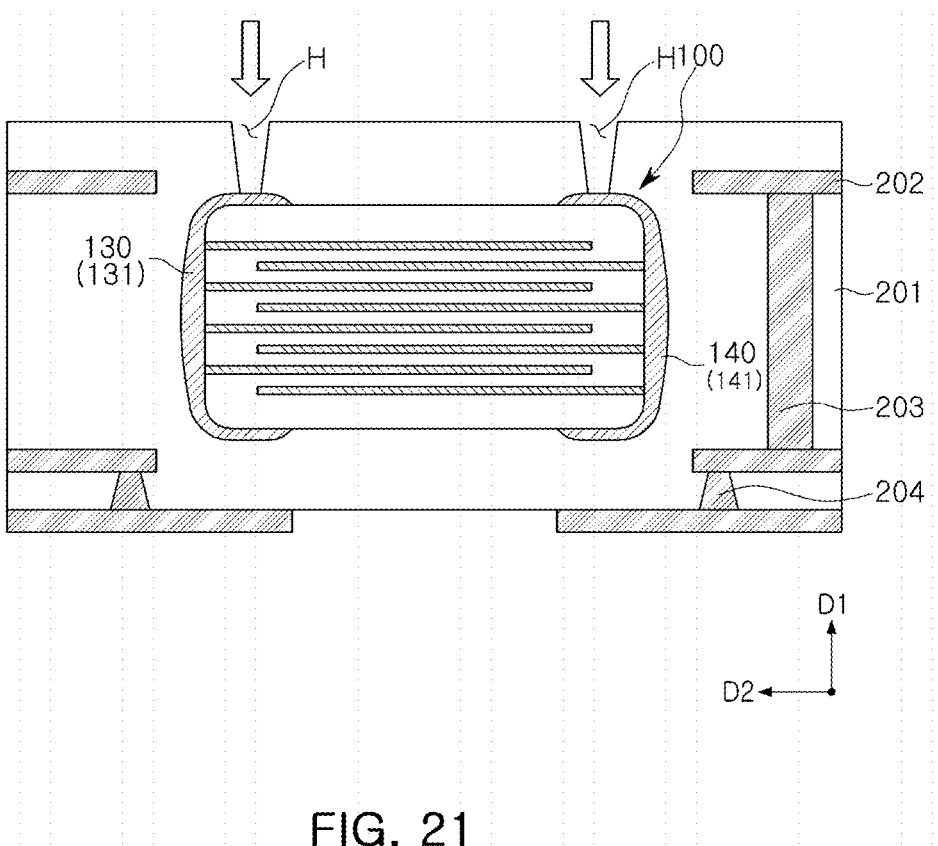
FIG. 21 illustrates an example of a process of forming a via hole in a substrate with an electronic component embedded therein.

Referring to FIGS. 20 and 21, a substrate with an electronic component embedded therein will be described. FIG. 20 is a cross-sectional view schematically illustrating a substrate with an electronic component embedded therein according to an embodiment, and FIG. 21 illustrates an example of a process of forming a via hole in a substrate with an electronic component embedded therein. Referring to FIG. 20, a substrate 200 with an electronic component embedded therein includes an insulating layer 201, a circuit layer 202, and an electronic component 100 connected to the circuit layer 202. In this case, as the electronic component 100, electronic components according to embodiments as described above may be used, and FIG. 20 illustrates the electronic component 100 of FIG. 2. As described with reference to FIG. 2, the electronic component 100 includes a body 110 including a dielectric layer 111 and internal electrodes 121 and 122, and external electrodes 130 and 140 disposed on the body 110, connected to the internal electrodes 121 and 122 and including low-reflection layers 131 and 141. The brightness of the surface of the low-reflection layers 131 and 141 is lower than the brightness of the surface of the body 110. Additionally, the substrate 200 with an electronic component embedded therein may further include a conductive via 205 penetrating through at least a portion of the insulating layer 201 and connecting the electronic component 100 and the circuit layer 202. A diameter D of the conductive via 205 may be 50 to 80 m, and the diameter D may be a maximum diameter. In detail, the diameter D of the conductive via 205 may be a maximum length in the second direction D2. In addition, the substrate 200 with an electronic component embedded therein may further include a through-via 203 connecting circuit layers 202 disposed above and below the electronic component 100 or a conductive via 204 connecting circuit layers 202 disposed on different levels.

The external electrodes 130 and 140 of the electronic component 100 include low-reflection layers 131 and 141 with relatively low surface brightness, and as a result, the connectivity between the conductive via 205 and the electronic component 100 may be improved. Referring to FIG. 21, when forming a via hole H in the insulating layer 201 by laser processing, the low-reflection layers 131 and 141 do not prevent the insulating layer 201 from absorbing laser energy, and thus the processing precision of the via hole H may be improved. On the other hand, in the embodiments of FIGS. 20 and 21, the circuit layer 202 and the electronic component 100 are connected only on one side, but the connection path may change. For example, based on FIG. 20, the electronic component 100 may also be connected to the circuit layer 202 through a lower surface of the electronic component 100, and to this end, a conductive via 203 may be additionally provided.

As set forth above, the electronic component according to an example may have excellent connectivity with a circuit pattern when embedded in a circuit board, and the reliability of a board having the electronic component embedded therein may be improved.

While example embodiments have been illustrated and described above, it will be apparent to those skilled in the art that modifications and variations could be made without departing from the scope of the present disclosure as defined by the appended claims.

What is claimed is:

1. An electronic component comprising:
   a body including a dielectric layer and an internal electrode; and
   an external electrode disposed on the body, connected to the internal electrode, and including a low-reflection layer,
   wherein brightness of a surface of the low-reflection layer is lower than brightness of a surface of the body,
   the low-reflection layer includes a plating layer containing a Ni—Zn-based material, and
   the Ni—Zn-based material further contains S.

2. The electronic component of claim 1, wherein a brightness value of Hue Saturation Value (HSV) measured in an image of the surface of the low-reflection layer is 45% or less.

3. The electronic component of claim 1, wherein the brightness of the surface of the low-reflection layer and the brightness of the surface of the body are obtained by measuring intensity of reflected light of white light emitted from the same light source.

4. The electronic component of claim 3, wherein the body includes a first surface and a second surface opposing each other in a first direction in which the dielectric layer and the internal electrode are stacked, and
   a portion of the external electrode covers a portion of the first surface of the body.

5. The electronic component of claim 4, wherein the brightness of the surface of the body is measured on another portion of the first surface of the body, and the brightness of the surface of the low-reflection layer is measured on a surface of an area covering the portion of the first surface of the body.

6. The electronic component of claim 4, wherein a thickness of an area covering the portion of the first surface of the body in the low-reflection layer is 5 μm or more.

7. The electronic component of claim 1, wherein the plating layer contains needle-shaped particles.

8. The electronic component of claim 7, wherein the needle-shaped particles contain at least one of Na and Cl.

9. The electronic component of claim 1, wherein the low-reflection layer includes metal particles and an oxide film disposed on surfaces of the metal particles.

10. The electronic component of claim 9, wherein the metal particles contain Ni, and the oxide film contains $Ni_2O_3$.

11. The electronic component of claim 9, wherein the low-reflection layer further includes an insulator in which the metal particles are dispersed.

12. The electronic component of claim 9, wherein the metal particles include at least one particle being in contact with the insulator and the oxide film.

13. The electronic component of claim 1, wherein the low-reflection layer includes a Ni sputtering layer.

14. The electronic component of claim 13, wherein the low-reflection layer includes an Ni—Zn alloy.

15. The electronic component of claim 1, wherein the low-reflection layer is disposed on an outermost side of the external electrode.

16. The electronic component of claim 1, wherein the low-reflection layer is directly connected to the internal electrode.

17. The electronic component of claim 1, wherein the external electrode further includes a base layer disposed between the body and the low-reflection layer.

18. The electronic component of claim 17, wherein the base layer includes at least one of Pd and Cu.

19. The electronic component of claim 1, wherein the body includes a first surface and a second surface opposing each other in a first direction in which the dielectric layer and the internal electrode are stacked, a third surface and a fourth surface located between the first and second surfaces and opposing each other in a second direction, and a fifth surface and a sixth surface located between the first and second surfaces and opposing each other in a third direction,
  the internal electrode includes a first internal electrode and a second internal electrode disposed alternately with each other, and
  the external electrode includes a first external electrode and a second external electrode connected to the first and second internal electrodes, respectively.

20. The electronic component of claim 19, wherein first and second internal electrodes extend to the third and fourth surfaces of the body, respectively, and
  the first and second external electrodes cover the third and fourth surfaces of the body, respectively.

21. The electronic component of claim 19, wherein first and second internal electrodes extend to the fifth and sixth surfaces of the body, respectively,
  the first and second external electrodes cover the fifth and sixth surfaces of the body, respectively, and
  a length of the body in the second direction is greater than a length in the third direction.

22. The electronic component of claim 19, wherein the first internal electrode extends to the third and fourth surfaces of the body, and the second internal electrode extends to the third and fourth surfaces of the body, and
  the first and second external electrodes are alternately disposed in the third direction on the third and fourth surfaces of the body.

23. The electronic component of claim 19, wherein first internal electrode extends to the first surface of the body, and the second internal electrode extends to the first surface of the body, and
  the first and second external electrodes cover the first surface of the body.

24. The electronic component of claim 23, wherein the first external electrode is provided as a plurality of first external electrodes, and the second external electrode is disposed between the plurality of first external electrodes based on the third direction.

25. The electronic component of claim 23, wherein the first and second external electrodes are not provided on the second surface of the body.

26. The electronic component of claim 25, wherein the first and second external electrodes are not provided on the fifth and sixth surfaces of the body.

27. The electronic component of claim 19, wherein the first internal electrode extends to the fifth and sixth surfaces of the body, and the second internal electrode extends to the third and fourth surfaces of the body, and
  the first external electrode covers the fifth and sixth surfaces of the body, and the second external electrode covers the third and fourth surfaces of the body.

28. An electronic component comprising:
  a body including a dielectric layer and an internal electrode; and
  an external electrode disposed on the body, connected to the internal electrode, and including a low-reflection layer,
  wherein a brightness value of HSV measured in an image of a surface of the low-reflection layer is 45% or less,
  the low-reflection layer includes a plating layer containing Ni—Zn-based material, and
  the Ni—Zn-based material further contains S.

29. The electronic component of claim 28, wherein the plating layer contains needle-shaped particles.

30. The electronic component of claim 29, wherein the needle-shaped particles contain at least one of Na and Cl.

31. The electronic component of claim 28, wherein low-reflection layer includes metal particles and an oxide film disposed on surfaces of the metal particles.

32. The electronic component of claim 31, wherein the metal particles contain Ni, and the oxide film contains $Ni_2O_3$.

33. The electronic component of claim 31, wherein the low-reflection layer further includes an insulator in which the metal particles are dispersed.

34. The electronic component of claim 31, wherein metal particles include at least one particle being in contact with the insulator and the oxide film.

35. The electronic component of claim 28, wherein the low-reflection layer includes a Ni sputtering layer.

36. The electronic component of claim 35, wherein the low-reflection layer includes an Ni—Zn alloy.

37. A substrate with an electronic component embedded therein, comprising:
  an insulating layer;
  a circuit layer; and
  the electronic component connected to the circuit layer,
    wherein the electronic component includes a body including a dielectric layer and an internal electrode, and an external electrode disposed on the body, connected to the internal electrode and including a low-reflection layer, and brightness of a surface of the low-reflection layer is lower than brightness of a surface of the body,
  the low-reflection layer includes a plating layer containing a Ni—Zn-based material, and
  the Ni—Zn-based material further contains S.

38. An electronic component comprising:
  a body including a dielectric layer and an internal electrode; and an external electrode disposed on the body, connected to the internal electrode, and including a Ni—Zn-based material as an outermost portion of the external electrode, and the Ni—Zn-based material further includes S.

39. The electronic component of claim 38, wherein a thickness of the Ni—Zn-based material is 5 µm or more.

40. The electronic component of claim 38, wherein the Ni—Zn-based material includes needle-shaped particles.

41. The electronic component of claim 40, wherein the needle-shaped particles contain at least one of Na and Cl.

42. The electronic component of claim 38, wherein the Ni—Zn-based material includes an Ni—Zn alloy.

43. The electronic component of claim 38, wherein the Ni—Zn-based material is directly connected to the internal electrode.

44. The electronic component of claim 38, wherein the external electrode further includes a base layer disposed between the body and the Ni—Zn-based material.

45. The electronic component of claim 44, wherein the base layer includes at least one of Pd and Cu.

46. An electronic component comprising:

a body including a dielectric layer and an internal electrode; and an external electrode disposed on the body, connected to the internal electrode, and including a layer including Ni particles and an oxide film disposed on surfaces of the Ni particles as an outermost layer of the external electrode, and the external electrode further incudes a low-reflection layer, the low-reflection layer includes a plating layer containing a Ni—Zn-based material, and the Ni—Zn-based material further includes S.

47. The electronic component of claim 46, wherein the oxide film contains $Ni_2O_3$.

48. The electronic component of claim 46, wherein the layer further includes an insulator in which the Ni particles are dispersed.

49. The electronic component of claim 46, wherein the Ni particles include at least one particle being in contact with an insulator and the oxide film.

50. The electronic component of claim 46, wherein the layer including the Ni particles and the oxide film is directly connected to the internal electrode.

51. The electronic component of claim 46, wherein the external electrode further includes a base layer disposed between the body and the layer including the Ni particles and the oxide film.

52. The electronic component of claim 51, wherein the base layer includes at least one of Pd and Cu.

* * * * *